US006288659B1

(12) United States Patent
Jalali et al.

(10) Patent No.: US 6,288,659 B1
(45) Date of Patent: Sep. 11, 2001

(54) DATA CONVERSION USING TIME MANIPULATION

(75) Inventors: Bahram Jalali, Sherman Oaks; Frederic Marie Alain Coppinger, Los Angeles, both of CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 09/250,467

(22) Filed: Feb. 16, 1999

Related U.S. Application Data

(60) Provisional application No. 60/076,116, filed on Feb. 27, 1998.

(51) Int. Cl.[7] ............................................. H03M 1/00
(52) U.S. Cl. ............................ 341/137; 359/331; 359/336
(58) Field of Search .......................... 341/137; 359/331, 359/336

(56) References Cited

U.S. PATENT DOCUMENTS

| | | | |
|---|---|---|---|
| 4,928,316 | * | 5/1990 | Heritage et al. ................. 455/600 |
| 5,010,346 | * | 4/1991 | Hamilton et al. ................ 341/137 |
| 5,521,703 | * | 5/1996 | Mitchell ......................... 356/301 |
| 5,714,954 | * | 2/1998 | Chung et al. ................... 341/147 |
| 5,793,907 | | 8/1998 | Jalai et al. . |
| 5,862,287 | * | 1/1999 | Stock et al. ..................... 385/123 |

OTHER PUBLICATIONS

Frankel et al., *High–performance photonic analogue–digital converter*, Electronics Letters vol. 33, No. 25, Dec. 4, 1997, pp. 2096–2097.*
W.J. Caputi, "Stretch: A Time–Transformation Technique", *IEEE Transactions on Aerospace. and Electronic Systems.*, 1971, vol. AES–7, pp. 269–278.

B.H. Kolner and M. Nazarathy, "Temporal Imaging with a Time Lens", *Optical Society of America*, 1989, vol. 14, No. 12, pp. 630–632.
A.A. Godil, B.A. Auld, and D.M. Bloom, "Time–Lens Producing 1.9 ps Optical Pulses", *Applied Physics Letters*, 1993, vol. 62, No. 10, pp. 1047–1049.
C.V. Bennet, E.P. Scott and B.H. Kolner, "Temporal Magnification and Reversal of 100Gb/s Optical Data with an Up–conversion Time Microscope", *Applied Physics Letters*, 1994, vol. 65, No. 20, pp. 2513–2515.
B.H. Kolner, "Generalization of the Concepts of Focal Length and f–number to Space and Time", *Optical Society of America*, 1994, vol. 11, No. 12, pp. 3229–3234.
K. Mori, H. Takara, S. Kawanishi, M. Saruwatari, et al., "Flatly broadened Supercontinuum Spectrum Generated in a Dispersion Decreasing Fibre with Convex Dispersion Profile", *Electronic Letters*, 1997, vol. 33, pp. 1806–1808.
S.T. Cundiff, W.H. Knox, and M.C. Nuss, "Active Feed–forward Channel Equalisation for Chirped Pulse Wavelength Division Multiplexing", *Electronic Letters*, 1997, vol. 33, No. 1.
F. Coppinger, A.S. Bhushan and B. Jalai, "Time Magnification of Electrical Signals Using Chirped Optical Pulses", *Electronics Letters*, Feb. 19, 1998, vol.. 34, No. 4, 399–400.

* cited by examiner

*Primary Examiner*—Howard L. Williams
(74) *Attorney, Agent, or Firm*—Gates & Cooper LLP (57) ABSTRACT

A method and apparatus for data conversion using time manipulation is disclosed. Ultrafast analog-to-digital (A/D) conversion and digital-to-analog I/A) conversion are achieved by optoelectronic time-stretching or time-compression, respectively. A pulsed laser is chirped by frequency spreading the laser output in either discrete or continuous fashion. The chirped output is then modulated with the electrical signal, and then frequency spread again. The output of the modulated signal is detected with a photodetector to convert the optical signal to a time-manipulated copy of the electrical signal.

19 Claims, 9 Drawing Sheets

DATA CONVERSION USING TIME MANIPULATION

CROSS REFERENCE TO RELATED APPLICATION

This application claims the benefit under 35 U.S.C. §119 (e) of co-pending and commonly assigned U.S. Provisional Patent Application Ser. No. 60/076,116, filed on Feb. 27, 1998, by Bahram jalali et al., entitled "A Method For Analog-To-Digital Conversion," which application is incorporated by reference herein.

BACKGROUND OF THE INVENTION

1. Field of the Invention

The invention relates in general to data conversion systems, and more particularly, to a method and apparatus for data conversion systems using time manipulation.

2. Description of Related Art

Signal speeds for electronics have dramatically increased over the past decade. Clocking speeds for computers are routinely in the hundreds of megahertz (MHz) region, and communications systems commonly use multi-gigahertz (GHz) carrier signals. Building high-speed receivers to capture and analyze such signals has become increasingly more difficult.

Time manipulation of signals has been proposed as a possible technique to match data rates of signals to the receiver or to observe phenomena that last for only a few nanoseconds (ns), e.g., signal transients, clock edges, and nuclear explosions. Considering the time/space equivalence of dispersion and diffraction, and in direct analogy to a spatial lens, an electrical signal may be stretched (or, alternatively, contracted) in time by subjecting the electrical signal to a dispersion-quadratic phase modulation-dispersion sequence. This concept remains mostly theoretical, however, because of the difficulty of obtaining high quadratic phase modulation rates and/or large bandwidth dispersion elements.

Some prior attempts at time stretching include an all-electrical time stretch system. In the electrical domain, highly dispersive elements are available; however, the small bandwidth of these elements limits the capability and performance of an all-electrical system.

All-optical systems have large bandwidth dispersive elements, but the all-optical system has difficulty producing a high quadratic phase modulation rate. Although resonant optical phase modulation has been used to attain high modulation rates, such systems are useful for very short periods of time. Compression of electrical signals is also difficult within electrical or optical conversion systems because of the reasons listed above relating to dispersion.

It can be seen, then, that there is a need for a system that can stretch or compress a signal in time. It can also be seen then that such a system must be able to be produced with standard components to increase usage times of the compression or dispersion system.

SUMMARY OF THE INVENTION

To overcome the limitations in the prior art described above, and to overcome other limitations that will become apparent upon reading and understanding the present specification, the present invention discloses a method and apparatus for altering the time base of an electrical signal. The time base can be altered in discrete or piecewise continuous fashion. A laser, typically an erbium-doped fiber laser, is chirped by frequency spreading the laser output. The chirped output is then modulated with the electrical signal, and then frequency spread again. The output of the modulated signal is detected with a photodetector to convert the optical signal back to an electrical signal.

The present invention overcomes the limitations of prior art solutions by using an optoelectronic time magnification system with electrical inputs and outputs. The linear chirp (quadratic phase modulation) is provided by a dispersed optical pulse from a mode-locked Erbium Doped Fiber Laser (EDFL). In addition to the ultra high bandwidth (~7.5 THz) and chirp rate, the present invention differs from others in that the bandwidth of the input signal is negligible compared to the chirp bandwidth. With this property available in the present invention, an approximation to an ideal time lens can be obtained without the need to disperse the input signal. By eliminating the initial dispersion of the input signal, less complicated designs can be used for the remainder of the system.

These and various other advantages and features of novelty which characterize the invention are pointed out with particularity in the claims annexed hereto and form a part hereof However, for a better understanding of the invention, its advantages, and the objects obtained by its use, reference should be made to the drawings which form a further part hereof, and to the accompanying detailed description, in which there is illustrated and described specific examples in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Overview

The present invention discloses a method and apparatus for altering the time base of an electrical signal. The time base can be altered in discrete or piecewise continuous fashion. A laser, typically an erbium-doped fiber laser, is chirped by frequency spreading the laser output. The chirped output is then modulated with the electrical signal, and then frequency spread again. The output of the modulated signal is detected with a photodetector to convert the optical signal back to an electrical signal.

The present invention also provides a method for analog-to-digital conversion of signals at a conversion speed or resolution that is in excess of that achievable by existing technology. In the present invention the analog electrical signal is slowed down or "time-stretched" prior to conversion. Alternatively, for a given resolution, it increases the sampling rate. The time-stretching is achieved using photonic devices. A high chirp rate is imposed on the electrical signal by mixing it with a dispersed ultra-short optical pulse in an electro-optic intensity modulator. This is followed by a passive optical dispersion element to produce a time-magnified copy of the input electrical signal. Thus, the signal is wavelength stamped by a chirped optical pulse. An arrayed waveguide grating provides parallel time-interleaved samples as well as a time-stretched serial sampled waveform.

System Diagram

Figure 1A:
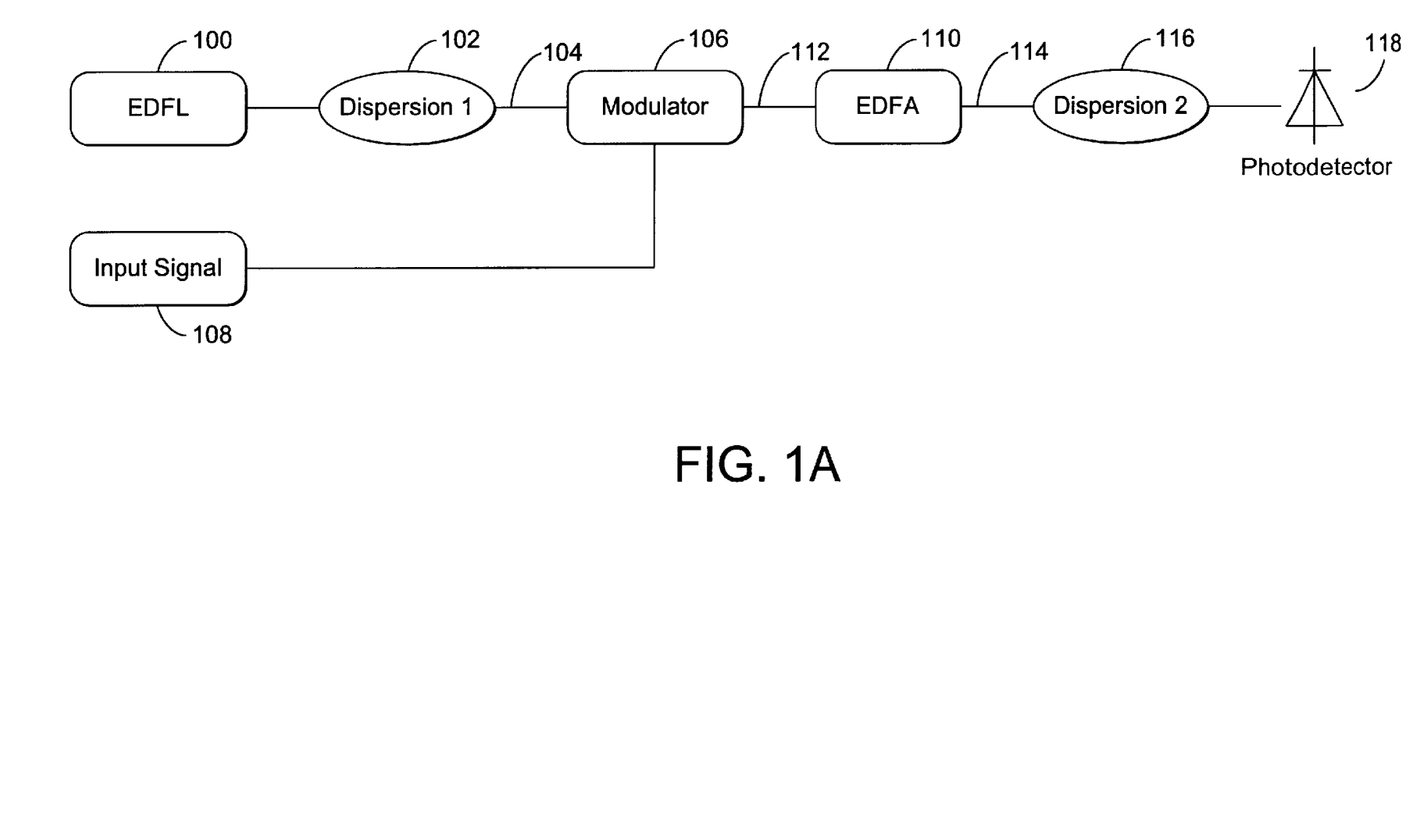
FIGS. 1A–1B illustrate block diagrams of the present invention.
Figure 1B:
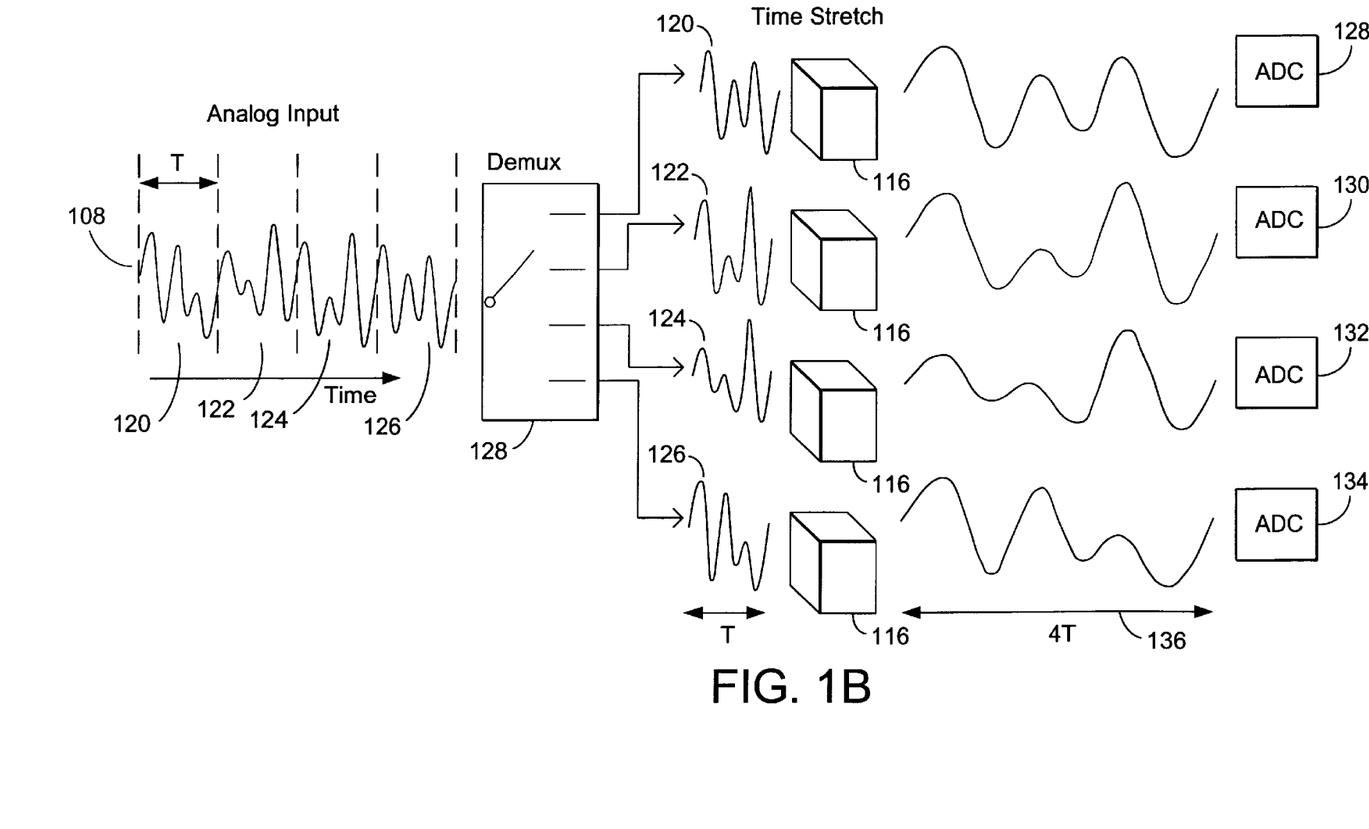

FIGS. 1A–1B illustrate a block diagram of the present invention. As shown in FIG. 1A, the output of laser 100 is input to a dispersion device 102. The dispersed output 104 is fed into modulator 106, along with electrical signal (input signal) 108. The modulator 106 mixes the dispersed output 104 and the electrical signal 106. An optional amplifier 110 can be used to amplify the modulator 106 output 112. The optional amplifier 110, when used must have either a flat spectral response, or, if optional amplifier 110 does not have a flat spectral response, the optional amplifier 110 must be corrected in the digital domain in the analog-to-digital conversion system. The output 114 of the amplifier 110, when present, or, when amplifier 110 is not present, modulator output 112, is fed into dispersion device 116. The output of dispersion device 116 is shined on photodetector 118. Photodetector 118 converts the output of dispersion device 116 from an optical signal to an electrical signal.

Typically, laser 100 is a mode-locked Erbium Doped Fiber Laser (EDFL) 100. Laser 100 generates pulses that are very short, typically 160 femtoseconds (fs) in length. These pulses are then "chirped" by sending the pulse into dispersion device 102. "Chirping" is defined to be time spreading the pulse by frequency component. Chirping a very short, e.g., 160 fs, pulse of simultaneously generated frequencies is performed by dispersion device 102. Dispersion device 102 is typically a length of optical fiber, usually a Single Mode Fiber (SMF), although dispersion device 102 can also be a highly dispersive fiber or a fiber Bragg grating. The length of dispersion devices 102 and 116 are typically between 4 and 10 km of SMF. The transmissive property of the SMF varies linearly with frequency, and thus, certain frequencies will travel slower through dispersion device 102 than others. Therefore, when the chirped pulse exits the dispersion device 102 as output 104, it is separated by frequency components in a linear fashion, since the transmissivity (or permittivity) of the dispersion device 102 is typically linear with respect to frequency. A non-linear stretching can be achieved by using a dispersion device 102 that has a transmissivity factor that non-linear with respect to frequency. The electrical signal 108 is applied to the electrical input of the modulator 106.

The electrical signal 108 to be stretched modulates the intensity of the output 104 by the modulator 106. Modulator 106 is typically a Mach-Zehnder electro-optical modulator.

The modulator 106 must have a high bandwidth, typically in the microwave or millimeter-wave regime. The efficiency of the modulator 106 is significantly higher than optical-optical mixing in a non-linear crystal. The resulting intensity modulated chirped signal, output 112, is then dispersed in a second dispersion device 116 to obtain further separation of frequency components. The output of dispersion device 116 is detected by a fast photodetector 118. The time stretched (slowed-down) electrical signal output of the photodetector 118 is then fed into an electronic A/D converter.

For elongation of the electrical signal 108, dispersion devices 102 and 116 will have the same sign; e.g., the dispersion devices 102 and 116 will disperse electrical signal 108 in the same manner. However, for compression of electrical signal 108, dispersion devices 102 and 116 will have opposite signs, e.g., dispersion devices 102 and 116 will oppositely affect electrical signal 108. Time inversion of the electrical signal 108 is achieved when the dispersion devices 102 and 116 have opposite signs and when the absolute value of the dispersion in the dispersion device 116 is higher than the absolute value of the dispersion in the dispersion device 102. An exact time inversion of the electrical signal 108, e.g., with no elongation or compression, is achieved when the dispersion in the dispersion device 116 is twice the dispersion in the dispersion device 102 and of the opposite sign.

FIG. 1B illustrates the electrical signal 108, which is a continuous time signal, being stretched by the present invention. Initially, electrical signal 108, which is an analog signal, is temporally dispersed into segments 120–126, each segment 120–126 being a predetermined time T long. This is performed by a demultiplexer or other segmenting device 128 having outputs which divide the electrical signal 108 into discrete segments 120–126. Each segment 120–126 is then passed through dispersion device 116, and photodetected and converted to a digital signal using analog-to-digital converters 128–134. To stretch an electrical signal 108 by a factor of n, n branches are needed in FIG. 1B to produce the corresponding stretched signal. The number of segments 120–126 is therefore not limited to four; however, the amount of time stretch 136, which is shown in FIG. 1B as 4T, is limited by the number of outputs of segmenter 128 and the availability of dispersion devices 116 and analog-to-digital converters 128–134.

Figure 2A:
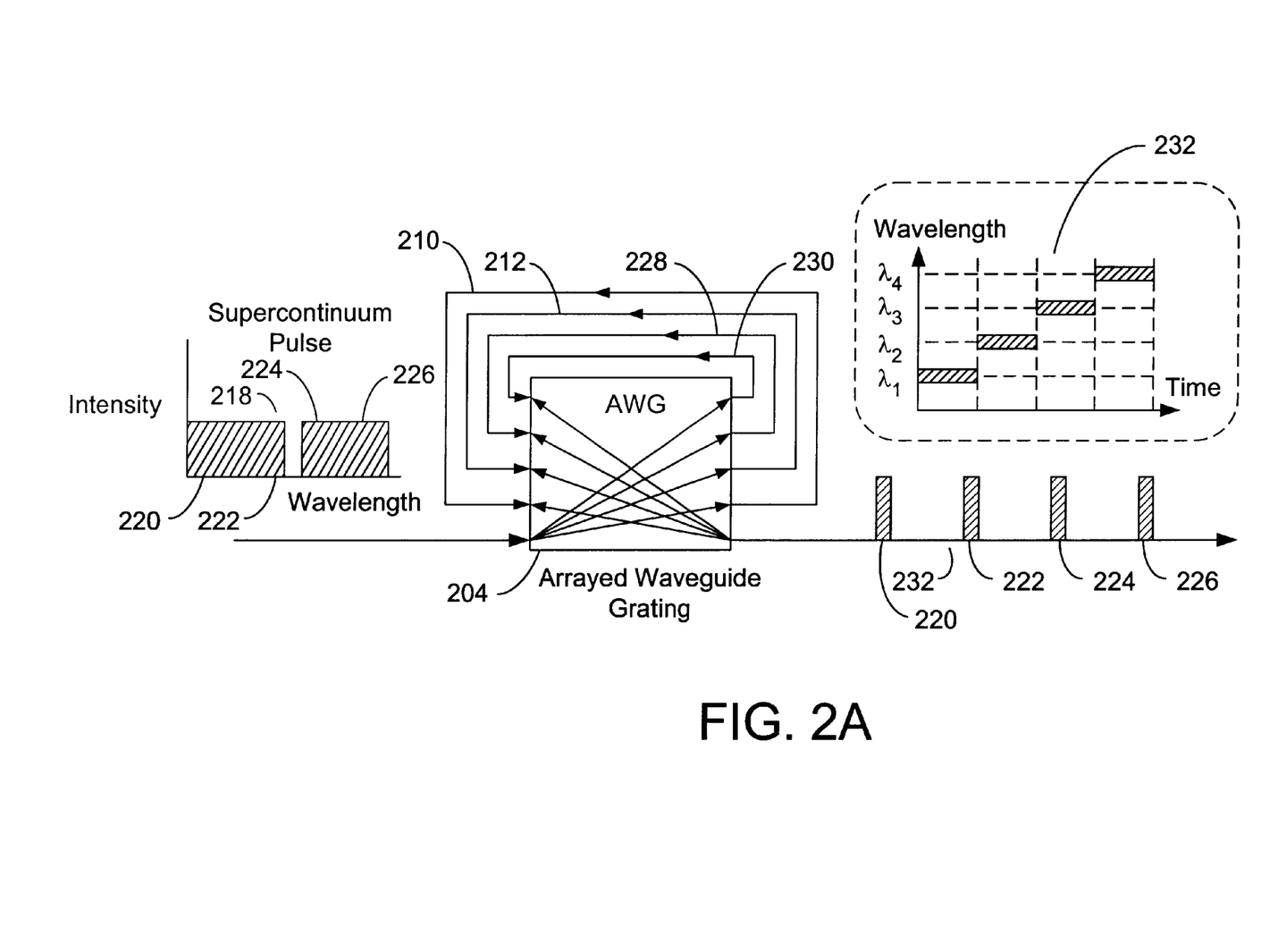
FIGS. 2A–2B illustrate a second embodiment of the present invention.
Figure 2B:
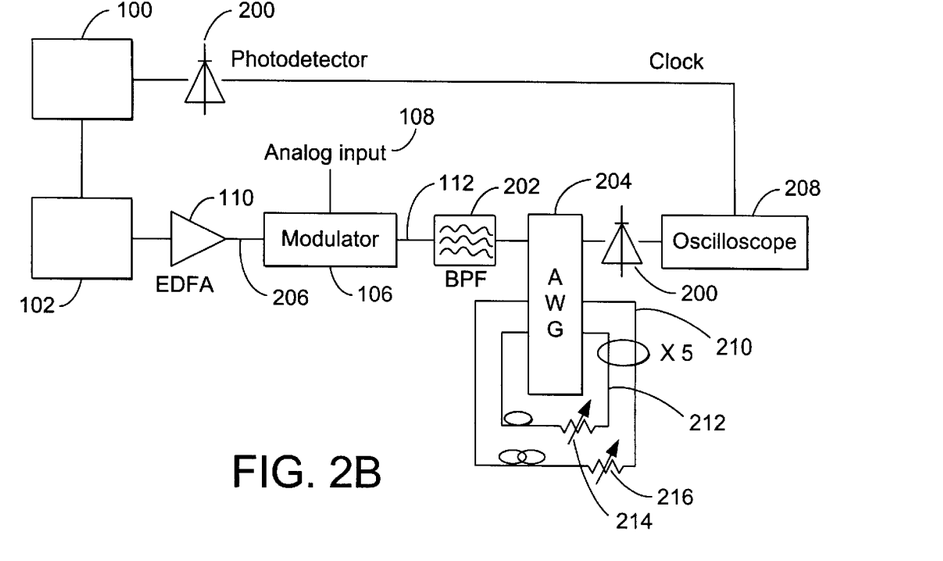

FIGS. 2A–2B illustrate a second embodiment of the present invention.

FIG. 2A illustrates an Arrayed Waveguide Grating (AWG) 204 which receives a supercontinuum pulse input 218 containing frequency components $\lambda 1$ 220 $\lambda 2$ 222, $\lambda 3$ 224, and $\lambda 4$ 226. As the frequency components $\lambda 1$ 220–$\lambda 4$ 226 pass through AWG 204, each component is delayed in time a different amount using outputs 210, 212, 228 and 230 of AWG 204 to delay each frequency component $\lambda 1$ 220–$\lambda 4$ 226 a different amount. The output 232, shown with respect to time, shows that each frequency component $\lambda 1$ 220–$\lambda 4$ 226 is now separated in time. The feedback architecture of the AWG, also called a Recirculating Photonic Filter (RPF), is further discussed in U.S. Pat. No. 5,793,907, issued Aug. 11, 1998 to Jalali et al., which patent is incorporated by reference herein.

As shown in FIG. 2B, a portion of the output of laser 100 is fed to photodetector 200 and used as a synchronizing (clock) signal for the system.

As shown, the optional amplifier 110 is placed before the modulator 106. However, optional amplifier 110 can be placed at other locations within the system. The placement of optional amplifier 110 is chosen based on the particular implementation of the system. In this embodiment, however, there is no second dispersion device 116. Instead, output 112 is passed through a bandpass filter (BPF) 202 and then through an Arrayed Waveguide Grating (AWG) 204. The AWG 204 typically has a channel spacing of 0.8 nm and a pass band of 0.3 nm. The electrical signal 108 and the chirped pulse 206 interact in the modulator 106 to produce a wavelength stamped intensity modulated optical signal, shown as output 112. The AWG 204 samples the optical spectrum and thus samples the time evolution of the electrical transient of output 112. Outputs from the AWG 204 ports representing time-interleaved samples are photodetected and displayed using a digital-sampling oscilloscope 208 to time-stretch the electrical signal 108. Outputs 210 and 212 of AWG 204 are used in a feedback configuration to AWG 204 inputs. Incremental delays 214 and 216, typically 1.3 ns, are used. The feedback architecture of AWG 204 provides discrete dispersion of frequency samples of output 112, and separates samples in time.

The embodiment of FIG. 1A is used for time limited (of limited time duration) electrical signals 108, e.g., an electrical signal 108 input to the embodiment of FIG. 1A can only be discrete. The embodiment of FIG. 1B is used for elongation or compression of continuous time electrical signals 108 only.

Figure 3:
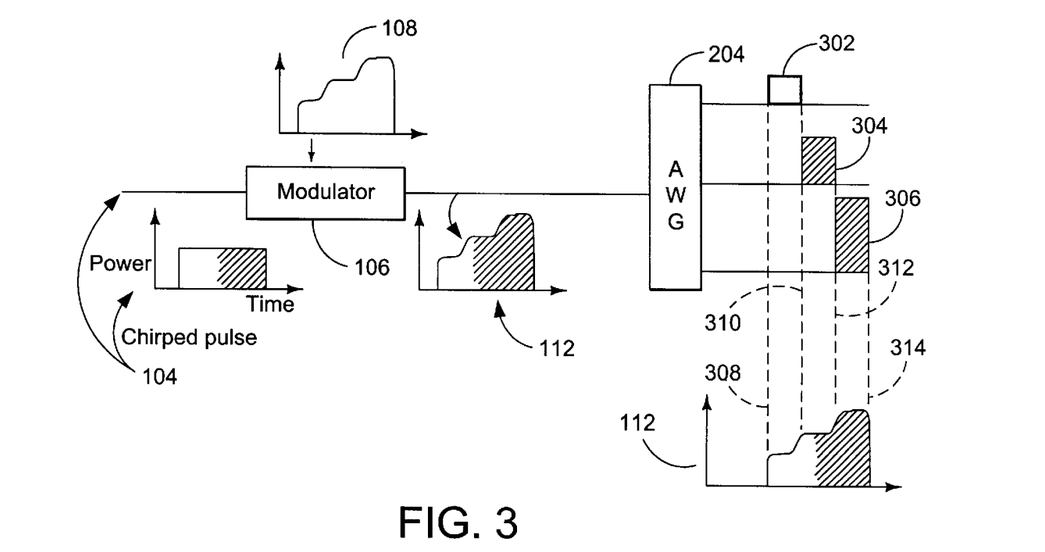
FIG. 3 illustrates a typical signal that passes through the system of FIG. 2.

FIG. 3 illustrates a typical signal that passes through the system of FIG. 2B.

Output 104 is shown being fed into modulator 106. Electrical signal 108 is a three step pulse, and is also fed into modulator 106. The resultant mixed output 112 is shown. As output is fed through AWG 204, the three frequency components of output 112 are separated by AWG 204 as output 302, 304, and 306, and the relationship between outputs 302–306 and output 112 is shown by the vertical lines 308–314.

Figure 4A:
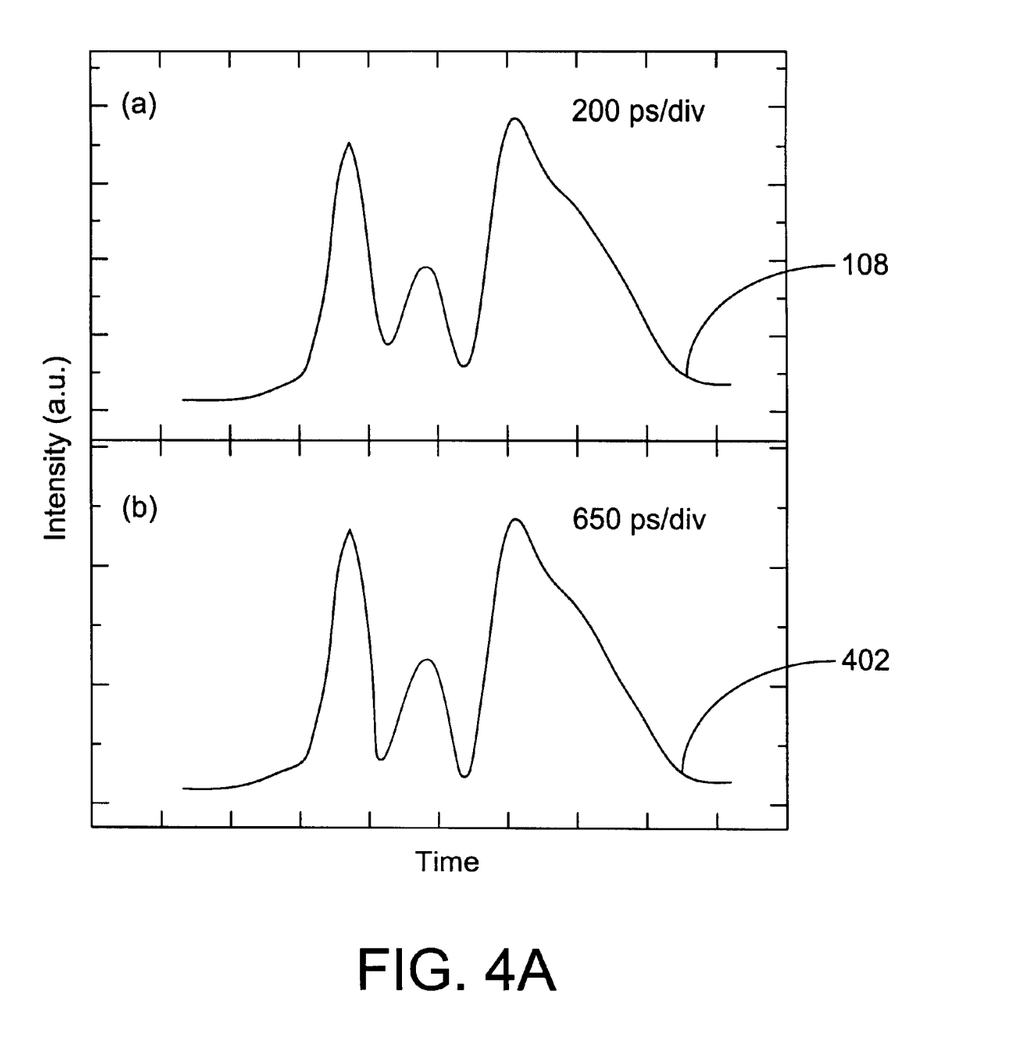
FIG. 4A illustrates an input signal that has been time stretched by the present invention.

FIG. 4A illustrates an input signal that has been time stretched by the present invention. Input 108 is shown on a x-y graph plotting intensity versus time as a 200 picosecond/ division (ps/div) waveform. The length of electrical signal 108 is 1600 ps (1.6 ns). Input 108 was passed through the system illustrated in FIG. 1 to generate waveform 402. Similar results are achieved by passing the electrical signal 108 through the system of FIG. 2. Waveform 402 is the electrical output of photodetector 118, and is shown at 650 ps/div. The length of waveform 402 is 5200 ps, or 5.2 ns. Thus, electrical signal 108 was time stretched by a factor of 3.3. The time stretch factor can be increased or decreased by using longer or shorter time dispersions within dispersion devices 102 and 116, or by using a different AWG 204.

The stretch factor is given by

M=1+D2/D1, where

M is the stretch factor;

D1=the time dispersion in dispersion device 102

D2=the time dispersion in dispersion device 116.

Fundamental Resolution of the System

The fundamental resolution of a conventional time lens in which the image is at the focal time of the lens is limited by its bandwidth and is estimated to be 1/B, where B is the chirp signal 104 bandwidth. If the image is not at the focal time, the image will be distorted. However, the resulting distortion is negligible if the electrical signal 108 bandwidth is negligible compared to the bandwidth of the chirp signal 104 over the same time interval. Further, the distortion is averaged out by the finite response time of the photodetector 118. This is explained in "Photonic Time-Stretch: A Potential Solution for Ultrafast A/D Conversion," by B. Jalali et al, International Topical Meeting on Microwave Photonics, Oct. 12–14, 1998, and "Time Stretch Preprocessing Overcomes the ADC Performance Barrier," By B. Jalali et al., Microwave and RF Magazine, which are incorporated by reference herein.

The resolution and linearity of the lens is also limited by the non-constant dispersion inside the dispersion device 102 fiber over the spectrum of the laser 100. Dispersion flattened fiber mitigates this problem. The influence of the non-flat optical spectrum on the electrical signal 108 can be minimized by spectrum equalization using a fiber Bragg-grating filter for AWG 204, a dispersion supercontinuum fiber for dispersion device 102, or using digital error correction.

As can be seen in FIGS. 1A–1B and 2A–2B, the electrical signal 108 can be stretched in a discrete manner, such as shown in FIG. 2B, or in a continuous manner, as shown in FIG. 1A. Of course, signals that take some time to produce might need to be stored so that the entire signal can be stretched in a continuous manner. Piecewise continuous signals, e.g., those that are produced for a certain time, then pause, then resume, can be stretched as well. Continuous signals can also be stretched using the present invention, but the concepts of the present invention are more easily understood using signals of short duration.

Using Time Spreading

The present invention has multiple uses. For example, an analog electrical signal 108 can be digitized using the present invention. As shown in FIG. 3, discrete outputs 302, 304, and 306 are obtained from analog electrical signal 108. The present invention thus extends the analog-to-digital (A/D) converter usability to very fast transient signals, an area that, at present, A/D converters are not able to operate in. A/D converters typically must operate at speeds that are four to ten times faster than the signals that the A/D converter is trying to digitize; for a 200 ps pulse, then an A/D must operate at 20–50 ps switching speeds, which is difficult for most electronic devices.

Although the discussion herein is directed to stretching a signal with respect to time, a signal can also be compressed in time using the same technique. For example, by using a dispersion device 102 that has a transmissivity that is inversely proportional to frequency, the laser 100 output would be compressed, and thus, when modulated with electrical signal 108, would compress electrical signal 108. Similar results are obtained using AWG 204, as well as other devices for dispersion device 102. A signal can also be time inverted using the same technique. If the amount of dispersion in the dispersion device 116 is higher than the amount of dispersion in the dispersion device 102 and of the opposite sign, the electrical signal 108 would be time inverted. For example, if the dispersion in the dispersion device 116 is double that of the dispersion device 102, and of the opposite sign of the dispersion device 102, the electrical signal 108 is time inverted with no compression or elongation. Similar results are obtained using AWG 204, or other dispersive elements for dispersion devices 102 and 116.

Since the amount of time stretching and/or contraction of an electrical signal 108 can be controlled by controlling dispersion devices 102 and 116, the compression technique of the present invention can be used for increased throughput of signals through signal lines. This can increase the throughput of computer modems, communications devices, communications spacecraft, and other devices that rely on electrical signals for the transmission of data. This is, in essence, a digital-to-analog D/A) converter. Further, the present invention can be used as a mux/demux for signals on a single input/output line. Still further, the use of a non-linear dispersion device can encrypt data for secure data transmission.

Figure 4B:
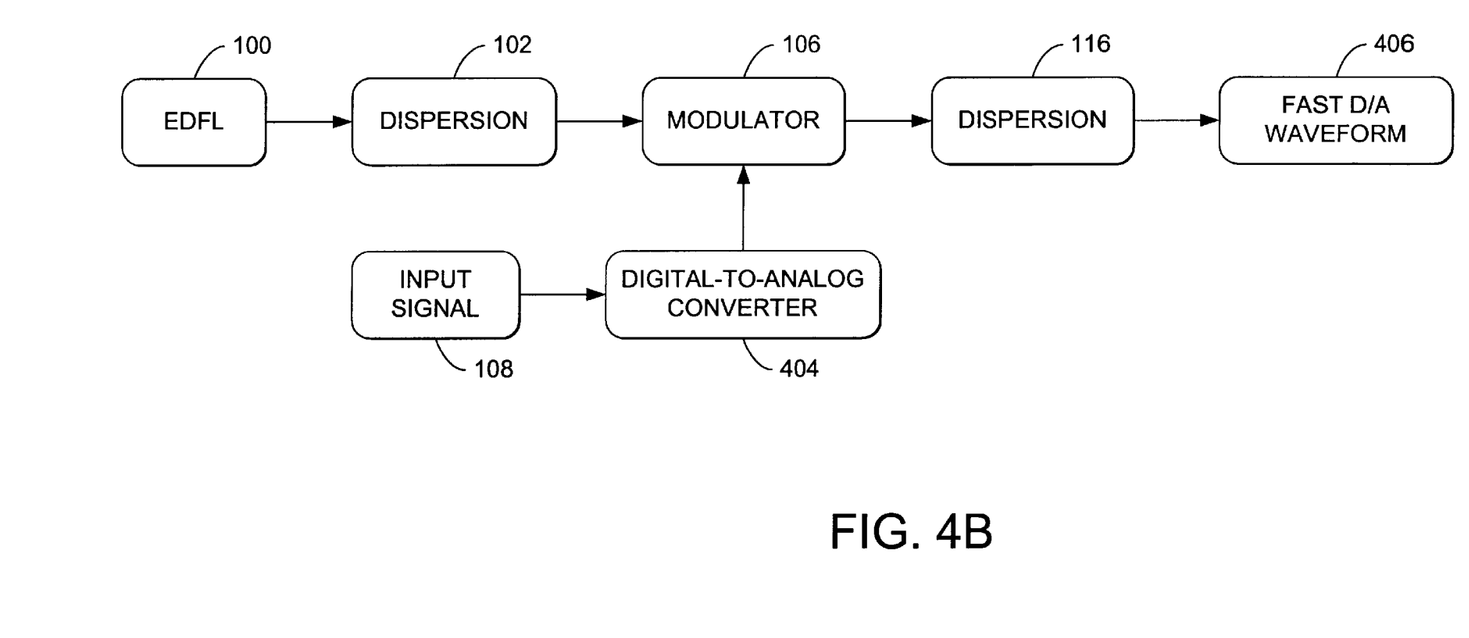
FIGS. 4B–4C illustrate the present invention used in various applications.

FIG. 4B illustrates the use of the present invention in a digital-to-analog converter system.

To use the present invention in a D/A context, a "slow" D/A converter 404, e.g., a D/A converter 404 that cannot be used for MHz or GHz signal speeds, can be inserted between the electrical signal 108 and the modulator 106. The electrical signal is typically a "slow" digital signal that can be detected by the D/A converter 404. This allows the modulator 106 to modulate, and therefore compress by use of the dispersion device 116, a slow electrical signal 108 that has already been D/A converted into a "fast" D/A waveform 406, which results in a fast analog waveform 406. Time inversion of an electrical signal is equivalent to a broadband phase conjugation of a microwave signal which can be used for signal processing. To use the present invention as a broadband phase conjugator, the dispersion device 116 has a dispersion which is equal to double that of the dispersion in the dispersion device 102, and of the opposite sign.

The present invention can also be used for spectroscopy. The time-to-wavelength dispersion of a signal can be used to produce a spectral image of a device in a time-ordered fashion with respect to frequency.

Figure 4C:
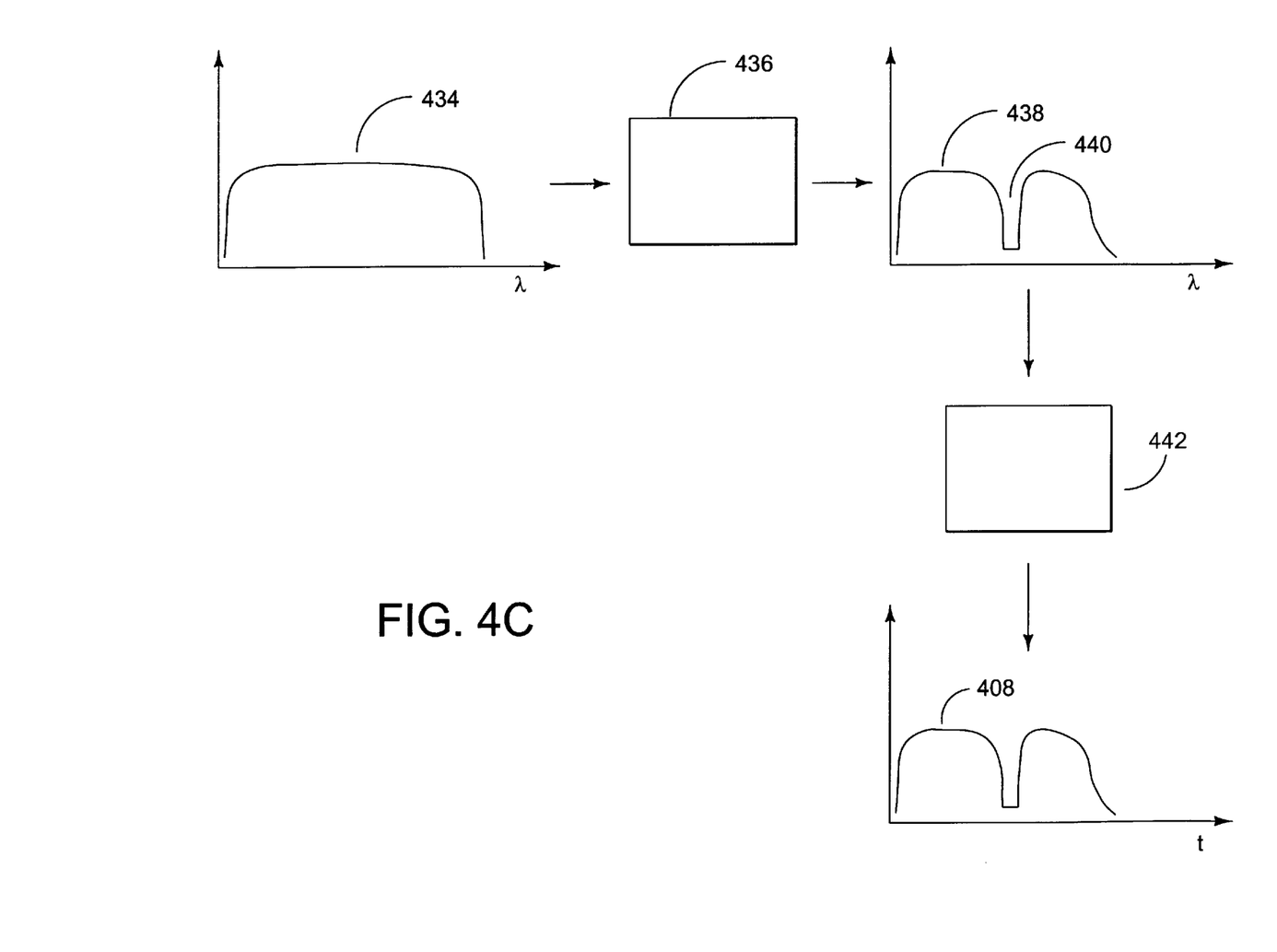

FIG. 4C illustrates a typical output waveform 408 of the present invention in a spectroscopy system. Typically in spectroscopy systems, a broadband optical signal 434 is input to a gas cell 436, where the gas in the gas cell 436 absorbs certain wavelengths of light. A typical output of the gas cell is waveform 438, which is still an optical signal, where wavelength 440 has been absorbed by the gas in gas cell 436.

Using the present invention, waveform 438 is used as an input to converter 442, which typically comprises dispersion device 116 and photodetector 118, but can also comprise analog-to-digital converter 128. Converter 442 converts the wavelength information into temporal information, as described with respect to FIGS. 1B and 2B, which results in output waveform 408.

The present invention is especially useful for analyzing electrical signals for events that produce electrical signals for a very short time. Such events include, but are not limited to, nuclear explosion data, Ultra-Wide Band/Short Pulse (UWB/SP) radar signature analysis, particle physics experiments, and other short-lived signal producing events.

The present invention is also useful as a waveform analyzer. Waveform analyzers for signals have proven useful for many analyses of electrical signals, and the present invention allows for very fast signals that are not amenable to analysis by present electronic analyzers to be analyzed in great detail.

Figure 4D:
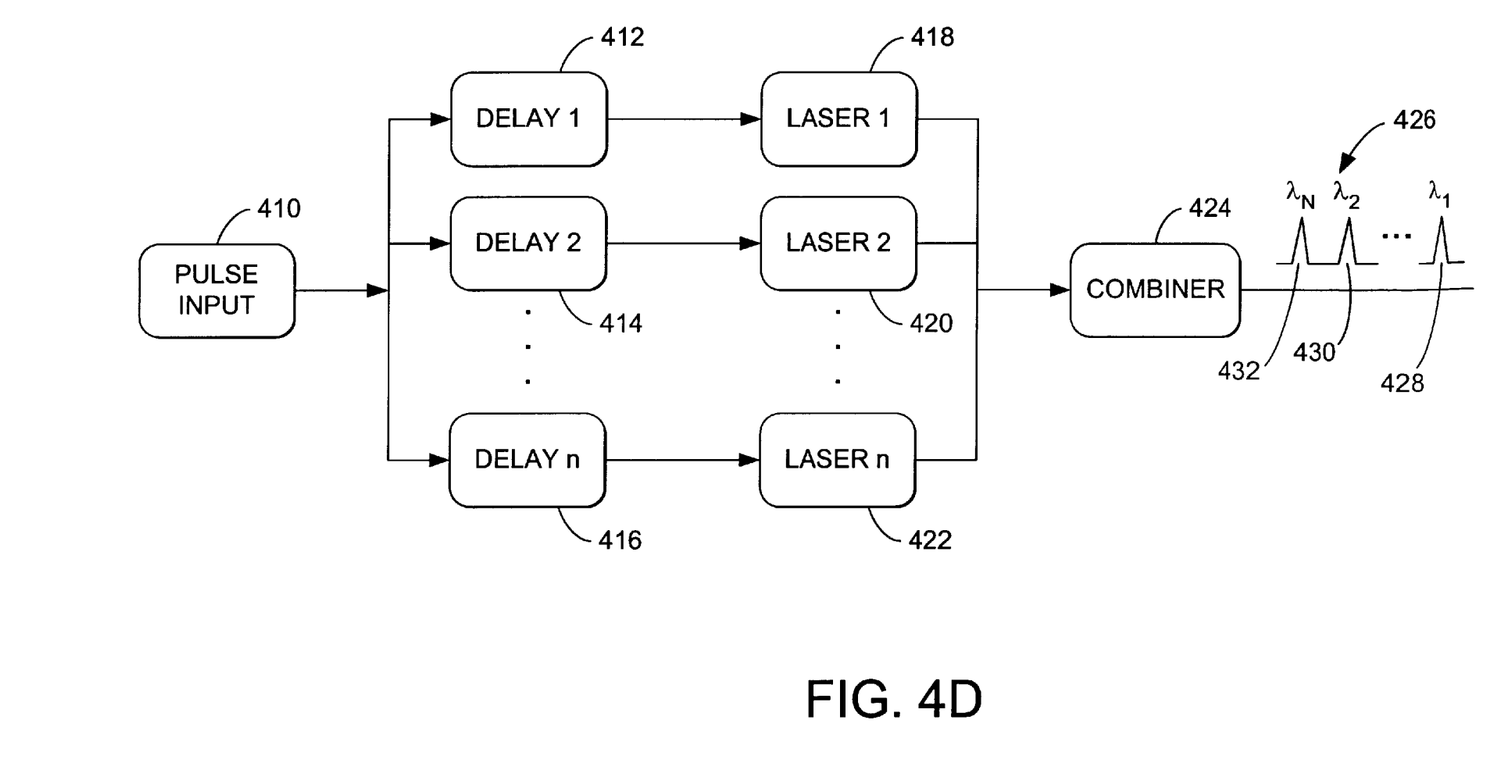
FIG. 4D illustrates an embodiment of a discrete chirp generator as used in the present invention.

FIG. 4D illustrates an embodiment of a discrete chirp generator as used in the present invention.

A pulse input 410 is used as an input to delay devices 412–416. Delay devices 412–416 can be optical or electrical in nature, depending on the nature of the signal that pulse input 410 provides. The delay devices 412–416 delay the delivery of pulse input 410's signal to lasers 418–422. The number of delay devices 412–416 and lasers 418–422 can be greater or less than those illustrated to create a number of waveforms as desired, and the illustration of three delay devices 412–416 and three lasers 418–422 is not meant to limit the present invention.

When lasers 418–422 receive the delayed pulse input, lasers 418–422 produce optical laser output, which is then combined in combiner 424. Laser 418 produces an output at frequency 1, laser 420 produces an output at a different frequency 2, and so on, such that each laser 418–422 produces a different frequency output. The resultant output 426 from combiner 424 is a pulse train with pulses at different frequencies, corresponding to the frequency outputs of lasers 418–422, where the pulses are now time delayed. For purposes of illustration, if delay 1 412 is less than delay 2 414, which is less than delay 3 416, then pulse 1 428 at frequency 1 emanating from laser 1 418 will be output first on output 426, followed by pulse 2 430 at frequency 2 emanating from laser 2 420, followed by pulse 3 432 at frequency 3 emanating from laser 3 422.

Logic of the Present Invention

Figure 5:
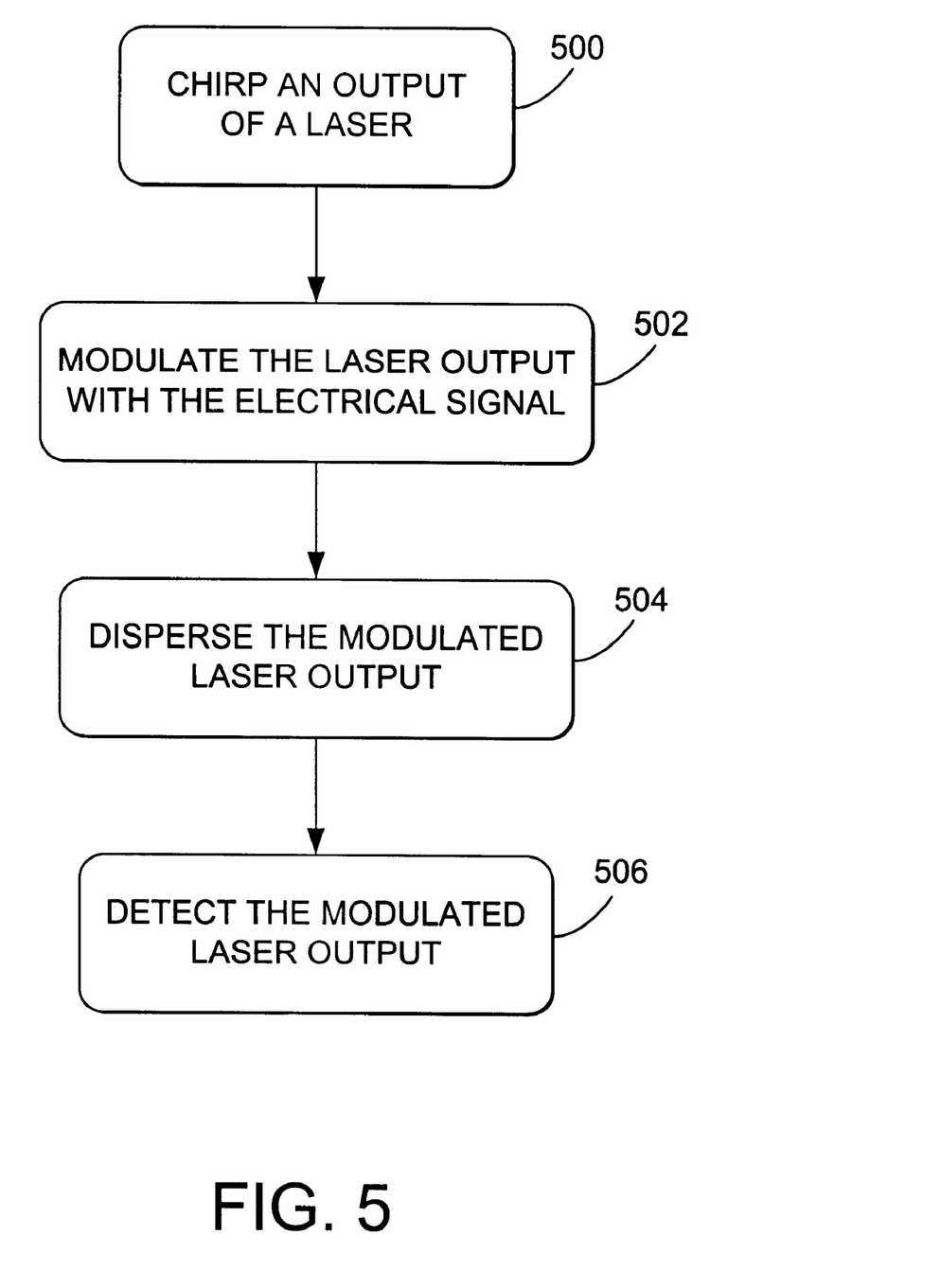
FIG. 5 is a flowchart illustrating the steps used in practicing the present invention.

FIG. 5 is a flowchart that illustrates exemplary logic used in performing the present mvention.

Block 500 represents the step of chirping an output of a laser. Chirping the output takes the simultaneously generated frequency components and separates them in time.

Block 502 represents the step of modulating the output of the laser with the electrical signal.

Block 504 represents the step of dispersing the modulated output of the laser. The dispersion separates the output either temporally or spatially. A temporal dispersion is typically performed using a length of optical fiber or a free space grating pair for continuous time dispersion. In discrete temporal dispersion systems, an AWG is used with feedback.

If the system uses spatial dispersion, then a sampling system as shown in FIG. 3 results.

Block 506 represents the step of detecting the modulated output. The detecting is typically done with a photodetector.

Conclusion

This concludes the description of the preferred embodiment of the invention. The following describes some alternative embodiments for accomplishing the present invention.

A method in accordance with the present invention comprises chirping a laser, typically an erbium-doped fiber laser, by frequency spreading the laser output. The chirped output is then modulated with the electrical signal, and then frequency spread again. The output of the modulated signal is detected with a photodetector to convert the optical signal back to an electrical signal.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for time-stretching an electrical signal for data conversion, comprising the steps of:

chirping an optical output of a laser;

modulating the chirped optical output with the electrical signal;

temporally dispersing the modulated optical output to time-stretch the modulated optical output; and detecting the temporally dispersed optical output to produce the time-stretched electrical signal therefrom.

2. The method of claim 1, wherein the laser is an erbium-doped fiber laser.

3. The method of claim 1, further comprising the step of amplifying the modulated optical output.

4. The method of claim 1, wherein the step of temporally dispersing is performed by an element selected from a group comprising an optical fiber, a free space grating, an arrayed waveguide grating with feedback, or a fiber Bragg grating.

5. The method of claim 1, wherein the step of chirping further comprises the step of temporally dispersing the chirped optical output.

6. The method of claim 5, wherein the step of temporally dispersing the modulated optical output is performed by an element selected from a group comprising an optical fiber, a freespace grating pair, an arrayed waveguide grating with feedback, and a fiber Bragg grating.

7. The method of claim 1, wherein a portion of the optical output is used as a clock signal.

8. The method of claim 1, wherein the time-stretched electrical signal is a digital representation of the electrical signal.

9. The method of claim 1, wherein the electrical signal is compressed.

10. The method of claim 1, wherein the electrical signal is time inverted.

11. The method of claim 1, wherein the step of detecting is performed by a photodetector.

12. The method of claim 1, further comprising the steps of filtering the modulated optical output and passing the modulated optical output through an arrayed waveguide grating.

13. An apparatus for time stretching an electrical signal for data conversion, comprising:

a laser producing an optical output;

a dispersion device for dispersing the optical output;

a modulator for modulating the electrical signal onto the dispersed optical output;

a dispersion device for dispersing the modulated optical output to time-stretch the modulated optical output; and a photodetector for detecting at least a portion of the dispersed optical output to produce the time-stretched electrical signal therefrom.

14. An apparatus for altering the time base of an electrical signal for data conversion, comprising:

a laser producing an optical output;

a device for modifying the optical output, wherein modifying is selected from a group comprising dispersing and compressing the optical output;

a modulator for modulating the electrical signal onto the modified optical output;

a dispersion device for dispersing the modulated optical output to time-stretch the modulated optical output; and a photodetector for detecting at least a portion of the dispersed optical output to produce the time-stretched electrical signal therefrom.

15. A method of time-stretching and converting an analog electrical signal to a digital electrical signal, comprising the steps of:

chirping an optical output of a laser;

modulating the chirped optical output of the laser with the analog electrical signal;

temporally dispersing the modulated optical output of the laser to time-stretch the modulated optical output;

detecting the temporally dispersed optical output; and digitizing the detected optical output with an electronic analog-to-digital converter to produce the time-stretched electrical signal therefrom.

16. A time-base altered electrical signal, wherein the time-base altered electrical signal is related to an input electrical signal, produced by the steps of:

chirping an optical output of a laser;

modulating the chirped optical output of the laser with the input electrical signal;

dispersing the modulated optical output of the laser to time-base alter the modulated optical output; and detecting the dispersed optical output, thereby producing the time-base altered electrical signal therein.

17. A tine-base altered signal, comprising:

a chirped optical signal; and an input electrical signal modulated onto the chirped optical signal; and the modulated optical signal temporally dispersed to alter its time-base, so that the input electrical signal derived therefrom is time-base altered.

18. A method of converting a slow digital signal to a high-speed analog signal, comprising the steps of:

inputting a slow digital electrical signal to a slow digital-to-analog converter to create a slow analog electrical signal;

chirping an optical output of a laser;

modulating the chirped optical output of the laser with the slow analog electrical signal;

temporally dispersing the modulated optical output of the laser to time-stretch the modulated optical output; and detecting the temporally dispersed optical output to produce a time-stretched electrical signal therefrom.

19. A method of converting wavelength information into temporal information, comprising the steps of:

passing a broadband optical signal through a gas cell to produce an optical output including wavelength information;

temporally dispersing the optical output to time-stretch the optical output; and detecting the temporally dispersed optical output to produce the temporal information therefrom.

* * * * *